(12) United States Patent
Xu et al.

(10) Patent No.: US 11,617,256 B2
(45) Date of Patent: Mar. 28, 2023

(54) LASER AND DRUM CONTROL FOR CONTINUOUS GENERATION OF BROADBAND LIGHT

(71) Applicant: KLA Corporation, Milpitas, CA (US)

(72) Inventors: Jian Xu, San Jose, CA (US); Lauren Wilson, San Jose, CA (US)

(73) Assignee: KLA Corporation, Milpitas, CA (US)

( * ) Notice: Subject to any disclaimer, the term of this patent is extended or adjusted under 35 U.S.C. 154(b) by 0 days.

(21) Appl. No.: 17/138,764

(22) Filed: Dec. 30, 2020

(65) Prior Publication Data

US 2022/0210901 A1   Jun. 30, 2022

(51) Int. Cl.
   *H05G 2/00*  (2006.01)
   *G03F 7/20*  (2006.01)

(52) U.S. Cl.
   CPC ......... *H05G 2/008* (2013.01); *G03F 7/70041* (2013.01); *G03F 7/70775* (2013.01); *H05G 2/003* (2013.01)

(58) Field of Classification Search
   CPC .... H05G 2/008; H05G 2/003; G03F 7/70041; G03F 7/70775
   See application file for complete search history.

(56) References Cited

U.S. PATENT DOCUMENTS

| 7,723,639 B2 | 5/2010 | Ellin et al. |
| 8,711,346 B2 | 4/2014 | Stokowski |
| 8,785,082 B2 | 7/2014 | Xiong et al. |
| 8,916,831 B2 | 12/2014 | Wang |
| 8,953,869 B2 | 2/2015 | Nasser-Ghodsi et al. |
| 8,963,110 B2 | 2/2015 | Hale et al. |
| 2016/0249442 A1 | 8/2016 | Kuritsyn et al. |
| 2017/0142817 A1 | 5/2017 | Kuritsyn et al. |
| 2017/0142818 A1 | 5/2017 | Kuritsyn et al. |

FOREIGN PATENT DOCUMENTS

| KR | 1020120114365 A | 10/2012 | |
| TW | 201729002 A * | 8/2017 | ........... G02F 1/0327 |
| WO | WO-2014205410 A1 * | 12/2014 | ............. G01N 21/95 |

OTHER PUBLICATIONS

International Search Report and Written Opinion in Application No. PCT/US2021/062333 dated Mar. 30, 2022, 6 pages.

* cited by examiner

*Primary Examiner* — Hung V Nguyen
(74) *Attorney, Agent, or Firm* — Suiter Swantz pc llo

(57) ABSTRACT

A broadband light source includes a rotatable drum coated with plasma-forming target material, a rotational actuator configured to rotate the rotatable drum, and a rotary encoder connected to the rotatable drum. The broadband light source may include a linear actuator configured to axially translate the rotatable drum and linear encoder connected to the rotatable drum. The broadband light source includes a pulsed laser source configured to direct pulsed illumination to a set of spots on the material-coated portion of the rotatable drum for exciting the plasma-forming target material and emitting broadband light as the drum is actuated. The broadband light source includes a control system. The control system is configured to receive one or more rotational position indicators from the rotary indicator and control triggering of the laser source based on the one or more rotational position indicators from rotary encoder.

30 Claims, 13 Drawing Sheets

LASER AND DRUM CONTROL FOR CONTINUOUS GENERATION OF BROADBAND LIGHT

TECHNICAL FIELD

The present disclosure generally relates to generation of broadband illumination and, more particularly, to generation of broadband illumination via a pulsed laser and a rotating drum covered in target material.

BACKGROUND

As the demand for lithography-based device structures having ever-smaller features continues to increase, the need for improved illumination sources used for inspection of the associated reticles that lithographically print these ever-shrinking devices continues to grow. One such illumination source includes an extreme ultraviolet (EUV) light source. One method of creating EUV light includes spinning a cylinder coated with a uniformly thick layer of solid (frozen) plasma-forming target material, such as xenon, and exposing the xenon-coated portion of the cylinder with a pulsed laser suitable for exciting the xenon to generate plasma. In addition, prior to the next pulse of illumination, the cylinder must be rotated and/or translated to expose a fresh region of solid xenon. As the cylinder rotates, gaseous xenon may be sprayed onto the cold non-illuminated portion of the surface of the cylinder, reforming the frozen xenon layer at previously-illuminated spots in order to fill the portions of the xenon ice consumed by the laser over time. A particular spot or zone is not exposed again until sufficient time has elapsed, allowing for the solid xenon surface to return to its original condition. Adjacent spots must be separated by some minimum distance in order to prevent damage to the cylinder surface.

The plasma creation takes place in a fixed location because the associated collection optics must be aligned to a known location and cannot follow a moving plasma source. The need for the plasma location to be fixed prevents the use of a moving illuminator laser spot. This creates a challenge in applications involving EUV light sources. To allow maximum operational time and inspection uniformity, an inspection tool should have a source of pulsed EUV light that is not interrupted, but rather runs at a chosen pulse frequency for a long period of time (e.g., months).

The creation of EUV light using solid xenon on a rotating cylinder has generally been accomplished with two methods. First, the cylinder, rotating at a constant speed, moves slowly in the axial direction from one end to the other, creating a helix of spots along the cylinder. When the helix intersects the top of the usable length of the xenon ice, the illuminating laser is blocked or turned off until the cylinder's vertical travel stops, and the direction of travel is reversed. The total length of time between subsequent illuminating laser exposures of the same location must be sufficient to allow the xenon ice to reform. The first method is undesirable as it provides non-continuous illumination output. In the second method, the cylinder is exposed by a laser source in an uninterrupted pattern and allows for the reconditioning of the target regions on the cylinder surface. In this method, the plasma targets may be formed in a first helical pattern (up path) and a return second helical pattern (down path). The second helical pattern may be interleaved with the first helical pattern, which allows for the continuous generation of EUV illumination. Such an approach is described in U.S. Pat. No. 8,963,110, which is incorporated herein by reference in the entirety. The second method suffers from the potential of laser crater overlap during the up path and the down return path. In addition, during the turn-around region (i.e., transition from up path to down path), the second method first requires acceleration of the cylinder and then deceleration of the cylinder to shift the laser column, which makes motion control relatively complicated and also creates mechanical and reliability challenges. The second method requires active control of the rotation of the cylinder and the vertical actuation of the rotating drum.

Therefore, it is desirable to provide a method and system that cure the deficiencies of the previous solutions identified above.

SUMMARY

A broadband light source is disclosed, in accordance with one or more embodiments of the present disclosure. In embodiments, the broadband light source includes a rotatable drum at least partially coated with plasma-forming target material. In embodiments, the broadband light source includes a rotational actuator configured to rotate the rotatable drum. In embodiments, the broadband light source includes a linear actuator configured to axially translate the rotatable drum. In embodiments, the broadband light source includes a rotary encoder connected to the rotatable drum, wherein the rotary encoder indicates a rotational position of the rotatable drum. In embodiments, the broadband light source includes a linear encoder connected to the rotatable drum, wherein the linear encoder indicates an axial position of the rotatable drum. In embodiments, the broadband light source includes a laser source configured to direct pulsed illumination to a set of spots on the material-coated portion of the rotatable drum for exciting the plasma-forming target material and emitting broadband light as the rotational actuator rotates the rotatable drum and the linear actuator translates the rotatable drum in an axial direction. In embodiments, the broadband light source includes a control system, wherein the control system is configured to receive one or more rotational position indicators from the rotary indicator and control triggering of the laser source based on the one or more rotational position indicators from the rotary encoder. In embodiments, the broadband light source is incorporated within a wafer or mask/reticle inspection system.

A method of generating broadband light is disclosed, in accordance with the one or more embodiments of the present disclosure. In embodiments, the method includes rotating a rotatable drum coated with a plasma-forming target material. In embodiments, the method includes axially actuating the rotatable drum. In embodiments, the method includes acquiring rotational position information from a rotary encoder connected to the rotatable drum. In embodiments, the method includes triggering a pulsed laser source based on the acquired rotational position information from the rotary encoder to form a first set of target locations for a down-stroke of the rotatable drum and a second set of target locations for an up-stroke of the rotatable drum offset from the first set of target locations. In embodiments, the method includes recoating previously targeted spots of the rotatable drum with plasma-forming target material.

It is to be understood that both the foregoing general description and the following detailed description are exemplary and explanatory only and are not necessarily restrictive of the present disclosure. The accompanying drawings, which are incorporated in and constitute a part of the specification, illustrate subject matter of the disclosure.

Together, the descriptions and the drawings serve to explain the principles of the disclosure.

BRIEF DESCRIPTION OF THE DRAWINGS

The numerous advantages of the disclosure may be better understood by those skilled in the art by reference to the accompanying figures.

DETAILED DESCRIPTION

Reference will now be made in detail to the subject matter disclosed, which is illustrated in the accompanying drawings.

FIGS. 1A through 12 generally illustrate embodiments of a system and method for generating continuous or near-continuous plasma-based illumination output, in accordance with one or more embodiments of the present disclosure.

Embodiments of the present disclosure are directed to the exposure of a rotating drum (e.g., cylinder) covered in plasma-forming material (e.g., frozen xenon or carbon dioxide), which may be excited via an illumination source (e.g., pulsed laser) to emit broadband light (e.g., broadband EUV light or soft x-ray light) from a set of uninterrupted target locations. Embodiments of the present disclosure are directed to the implementation of a rotary encoder to serve as a laser triggering reference. Utilization of the rotary encoder as a laser triggering reference eliminates or at least reduces the overlapping of laser craters caused during upward and downward paths of the laser across the drum. The target material needs some time to recover after being hit with the laser so the as the drum is rotating and translating to provide a new target surface, creating a spiral pattern. The top and bottom of travel path presents the largest challenge since the drum must reverse direction without the laser impacting one of the recently impacted locations (i.e., craters). Embodiments of the present disclosure solve this issue by i) adjusting the laser frequency slightly at the turn around locations; or ii) adjusting the rotational speed of the cylinder to achieve the same effect. Embodiments of the present disclosure are directed to shifting crater spacing by one column in the time of one revolution during turn-around regions. The combination of the i) use of the rotary encoder as a laser triggering reference; and ii) the shifting of crater spacings allows for a constant illuminating laser pulse frequency, easier cylinder control, and fewer mechanical design challenges while improving reliability. In either implementation, encoders are utilized to ensure the same target location is not impacted twice within too short a timeframe. In additional embodiments, the encoder information may also be used to synchronize the laser pulses with the sensor/camera of an inspection tool.

Additional embodiments of the present disclosure provide for a reticle inspection system, a wafer inspection system or a lithography system (or other optical system) incorporating the plasma-based rotatable drum source described herein.

Figure 1A:
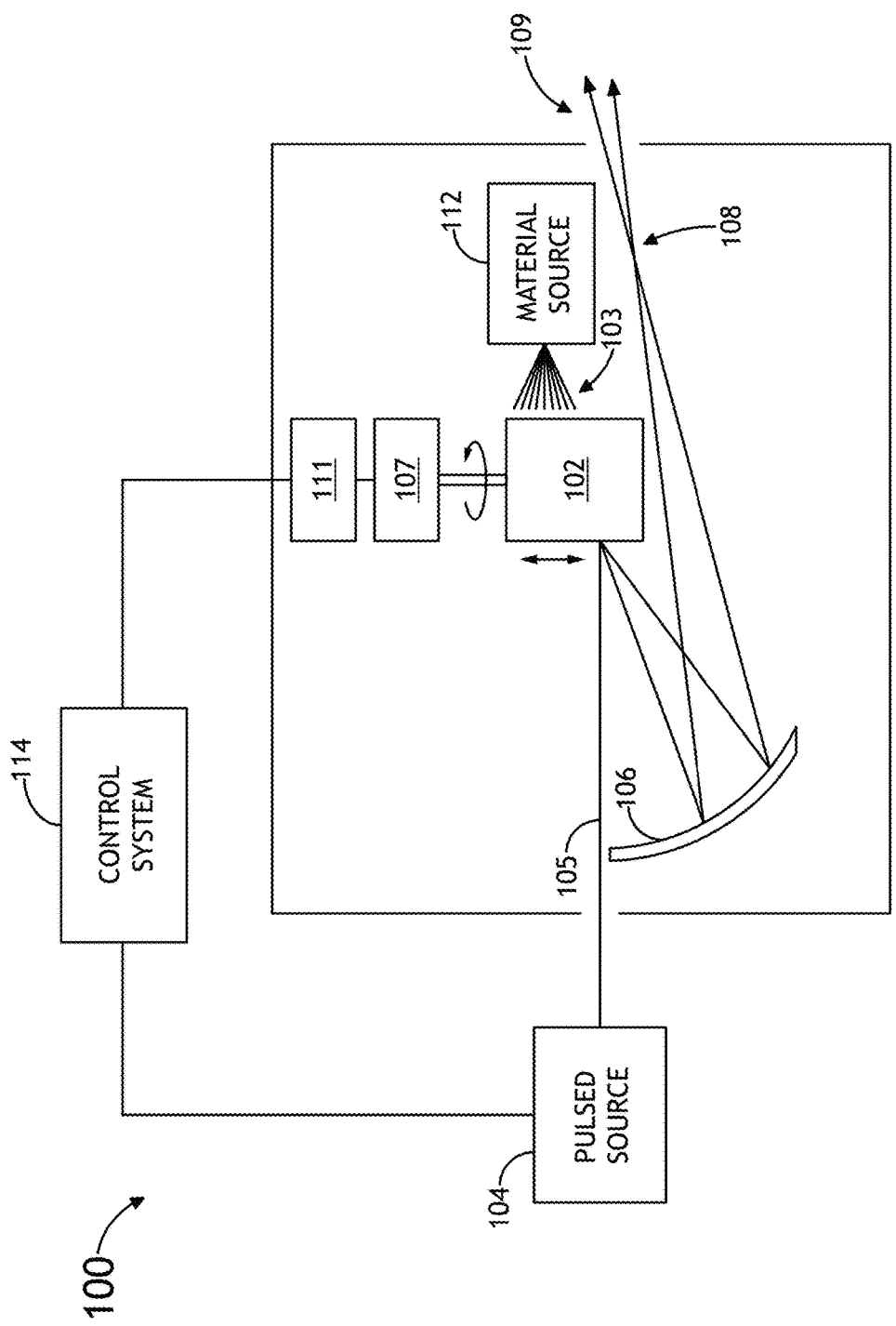
FIGS. 1A and 1B illustrate a simplified conceptual view of a broadband source for generating a continuous or near-continuous plasma-based illumination output, in accordance with one or more embodiments of the present disclosure.
Figure 1B:
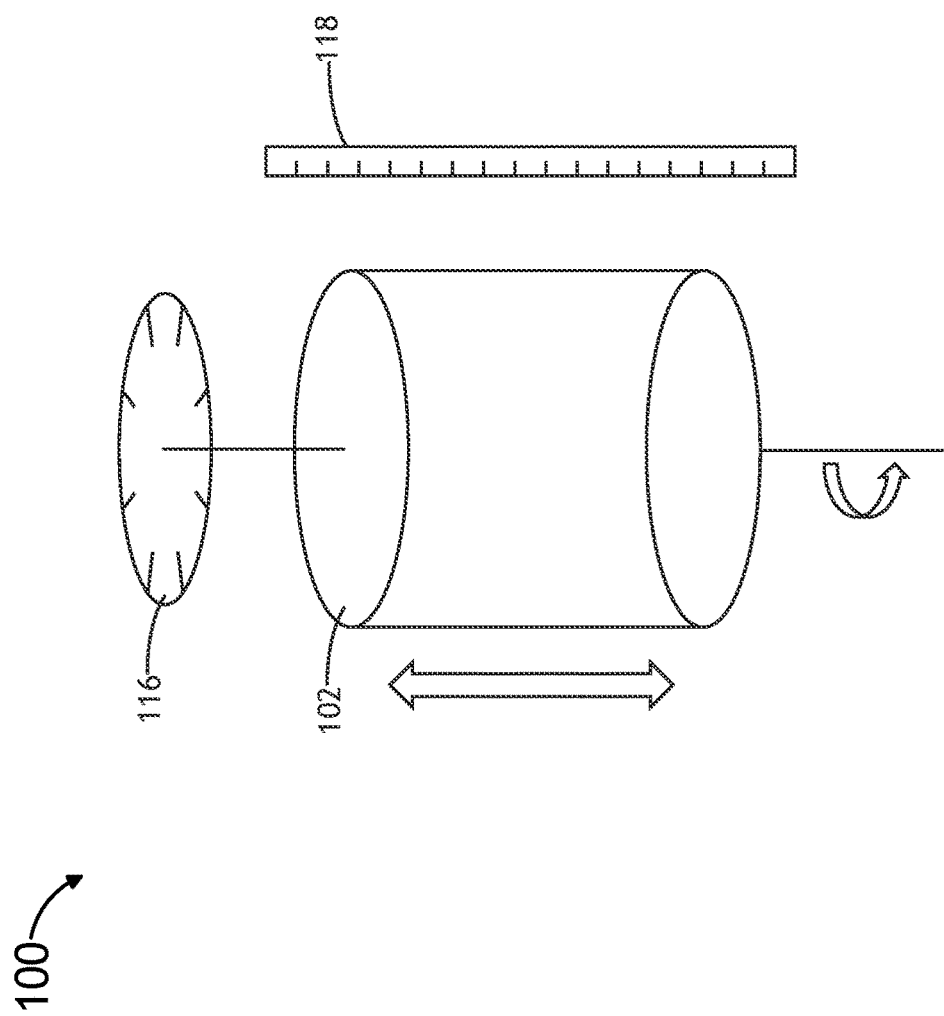

FIGS. 1A and 1B illustrate a simplified conceptual view of a broadband source 100 for generating a continuous or near-continuous plasma-based illumination output, in accordance with one or more embodiments of the present disclosure.

In embodiments, the Broadband source 100 includes a rotatable drum 102 suitable for rotation about an axis. For example, the drum 102 may be a cylinder, as shown in FIG. 1A. In other embodiments, the drum 102 includes any cylindrically-symmetric shape known in the art. For example, the drum 102 may include, but is not limited to, a cylinder, a cone, a sphere, an ellipsoid and the like. Further, the drum 102 may include a composite shape consisting of two or more shapes. It is noted herein that for the purposes of descriptive convenience the Broadband source 100 and related embodiments are described in the context of a rotatable or rotating drum 102, as depicted in FIG. 1A, however this embodiment should not be interpreted as a limitation on the scope present disclosure.

In embodiments, the drum 102 is at least partially coated with a plasma-forming target material 103. The target material 103 may include a solid material disposed on the surface of the drum 102. The plasma-forming target material 103 may include any material known in the art that generates plasma when excited by an illumination source and subsequently emits broadband light. The broadband light emitted by the plasma may include, but is not limited to, broadband soft x-ray light, broadband EUV light, broadband DUV light, broadband VUV light, broadband UV light, broadband visible light, and/or broadband IR light. For example, the target material 103 may include, but is not limited to, xenon frozen onto the surface of the drum 102. It is noted that the utilization of frozen xenon as a target material 103 may be particularly useful in the context of generating broadband EUV light. By way of another example, the target material 103 may include, but is not limited to, carbon dioxide frozen onto the surface of the drum 102. It is noted that the utilization of frozen carbon dioxide as a target material 103 may be particularly useful in the context of generating broadband soft x-ray light.

In embodiments, the Broadband source 100 includes a pulsed illumination source 104. The pulsed illumination source 104 may include any pulsed or modulated illumination source known in the art. For example, the pulsed source 104 may include, but is not limited to, a pulsed laser. Further, the pulsed illumination source 104 is suitable for initiating and/or maintaining a plasma in the material 103. For example, the pulsed illumination source 104 may include, but is not limited to, one or more infrared (IR) lasers. For instance, the pulsed illumination source 104 may include, but is not limited to, one or more $CO_2$ lasers.

In embodiments, the Broadband source 100 includes one or more actuators configured to actuate the drum 102 rotationally and axially. In embodiments the Broadband source 100 includes a rotational actuator 107 configured to rotate the drum 102 about an axis. The rotational actuator 107 may include any rotational actuator known in the art including, but not limited to, one or more servo motors. Additionally, the Broadband source 100 may include a linear actuator configured to translate the drum 102 along an axial direction 111 (e.g., vertical direction in the example shown in FIG. 1A). It is recognized herein that the present disclosure is not limited to the rotational and linear actuators 107, 111 in FIG. 1A. As such, the description provided above should be interpreted merely as illustrative. For instance, the pulsed source 104 may be disposed on an actuating stage (not shown), which provides translation of the pulsed illumination 105 relative to the drum 102.

The axial motion imparted by the linear actuator 111 and the rotational motion of the drum 102 caused by rotational actuator 107 allows for tracing of the pulsed illumination 105 in a set of spots across the surface of the drum 102. The set of spots may include a first set of spots arranged in a first spiral pattern and a second set of spots arranged in a second spiral pattern. The first set of spots and the second set of spots are interleaved such that spots from the second set of spots does not overlap with spots from the first set of spots. In this regard, the first set of spots may form a first spiral (or helical) pattern during rotational and axial acceleration of the drum 102, while the second set of spots form a return second spiral (or helical) pattern that avoids overlapping the first pattern. Examples of such patterns are discussed in greater detail further herein.

In embodiments, the Broadband source 100 includes one or more encoders. For example, as shown in FIG. 1B, the system may include a rotary encoder 116. The rotary encoder 116 may be mechanically attached to the rotational actuator 107 (e.g., servo motor). In this sense, the rotary encoder 116 may be integrated with the rotational actuator 107 and configured to indicate a rotational position of the rotatable drum 102, which is in turn coupled to the rotational actuator 107 via a shaft. In embodiments, the position indicator information from the rotary encoder 116 may be electronically read out of the rotary encoder 116 via a control system 114 (e.g., via electrical wires from the rotary encoder 116). This position indicator information may then be utilized by the control system 114 to control or adjust the pulsed laser source 104 and/or the motion of the rotational drum 102. For example, the position indicator information from the rotary encoder 116 may be used as a triggering reference for the pulsed laser source 104. By way of another example, the position indicator information from the rotary encoder 116 may be used to adjust the rotational/linear speed of the drum 102 (e.g., by controlling the rotational actuation 107 and/or linear actuator 111). In additional embodiments, position indicator information may be utilized by the control system 114 to synchronize the pulsed illuminating source 104 and the detector (e.g., camera or one or more sensors) that detects illumination from an inspected sample. In embodiments, the Broadband source 100 may utilize a linear encoder 118 to control certain aspects of the drum 102. The linear encoder 118 may be mechanically attached to the linear actuator 107. In this sense, the linear encoder 118 may be integrated with the linear actuator 111 and configured to indicate an axial (e.g., vertical) position of the rotatable drum 102. In embodiments, the position indicator information from the linear encoder 118 may also be electronically read out of the linear encoder 118 via the control system 114 (e.g., via electrical wires from the linear encoder 118). The position indicator information from the linear encoder 118 may then be utilized by the control system 114 to control or adjust the pulsed laser source 104 and/or the motion of the rotational drum 102. For example, the position indicator information from the linear encoder 118 may be used as a triggering reference for the pulsed laser source 104. By way of another example, the position indicator information from the linear encoder 118 may be used to adjust the rotational/linear speed of the drum 102 (e.g., by controlling the rotational actuation 107 and/or linear actuator 111). In additional embodiments, position indicator information from the linear encoder 118 may be utilized by the control system 114 to synchronize the pulsed laser source 104 and the detector that detects illumination from an inspected sample. In additional embodiments, the Broadband source 100 may simultaneously implement the rotational encoder 116 and the linear encoder 118 to control the triggering of the pulsed laser source 104 and/or the rotational and linear position of the drum 102 as well as detector/laser source synchronization.

In embodiments, the Broadband source 100 includes a control system 114. The control system 114 may be communicatively coupled to the rotational and/or linear actuators 107, 111 and/or the pulsed laser source 104. In embodiments, the control system 114 controls the triggering of the pulsed laser source 104 and/or actuation of the drum 102 along the rotational direction and/or the axial direction. In this regard, the control system 114 may direct the actuators 107, 111 and the drum 102 to trace the pulsed illumination 105 across the surface of the cylinder, as the cylinder rotates and axially translates, in any manner described in the present disclosure.

In embodiments, the broadband source 100 includes a material source 112. The material source 112 may contain material used to coat the drum 102. For example, the material source 112 may be used to apply a selected material to the surface of the drum 102. In embodiments, the material source 112 may direct a gas, liquid stream, or spray onto the surface of the drum 102 as it rotates and is maintained at a temperature below the freezing point of the selected material. For example, the selected material may include, but is not limited to, xenon, carbon dioxide and like materials. For instance, in the case of xenon, the drum 102 may be cooled below the xenon freezing point (e.g., −111.8° C.). Then, xenon may be applied to the surface of the drum 102 causing the xenon to freeze onto the surface of the drum 102 as it is rotated, thereby forming a solid xenon layer on the surface of the drum 102. In another instance, in the case of carbon, the drum 102 may be cooled below the carbon dioxide freezing point (e.g., −78° C.). Then, carbon dioxide may be applied to the surface of the drum 102 causing the carbon dioxide to freeze onto the surface of the drum 102 as it is rotated, thereby forming a solid carbon dioxide layer on the surface of the drum 102. In embodiments, the drum 102 may include an internal reservoir for containing a coolant material. For example, the drum 102 may include an internal reservoir holding a volume of liquid nitrogen used to cool the applied xenon or carbon dioxide below the freezing point for the respective material. In embodiments, the material source 112 is configured to recoat portions of the rotatable drum 102 with the plasma-forming material 103. For example, the material source 112 is configured to recoat previously-illuminated portions of the drum 102 with the plasma-forming material 103. For instance, the material source 112 may recoat spots previously cratered by the pulsed illumination 105 with a plasma-forming material, such as, but not limited to, xenon or carbon dioxide. Further, the length of the drum 102 and the vertical speed of the drum 102 may be selected so as to provide ample time for the plasma-forming material (e.g., xenon or carbon dioxide) to solidify on the drum 102 before the next illumination exposure.

In embodiments, the Broadband source 100 includes one or more collection optical elements 106 arranged to collect plasma-based illumination emanating from the plasma-formed regions on the drum 102. For example, after light is generated by the plasma excited by the pulsed source 104, the light may then be collected by collection optics 106. For example, the collection optics 106 may include any collector or collection optics known in the art. For instance, in the case of EUV light generation, the collection optics 106 may include any collector or collection optics known in the art compatible with EUV light. In another instance, in the case of soft x-ray light generation, the collection optics 106 may include any collector or collection optics known in the art compatible with soft x-ray light. In embodiments, the collection optics 106 may direct and/or focus illumination 109 emanating from the drum 102 to one or more downstream optical elements. In embodiments, the collection optics 106 may be configured to focus illumination emanating from the drum 102 to an intermediate focus 108, as shown in FIG. 1A.

Figure 2:
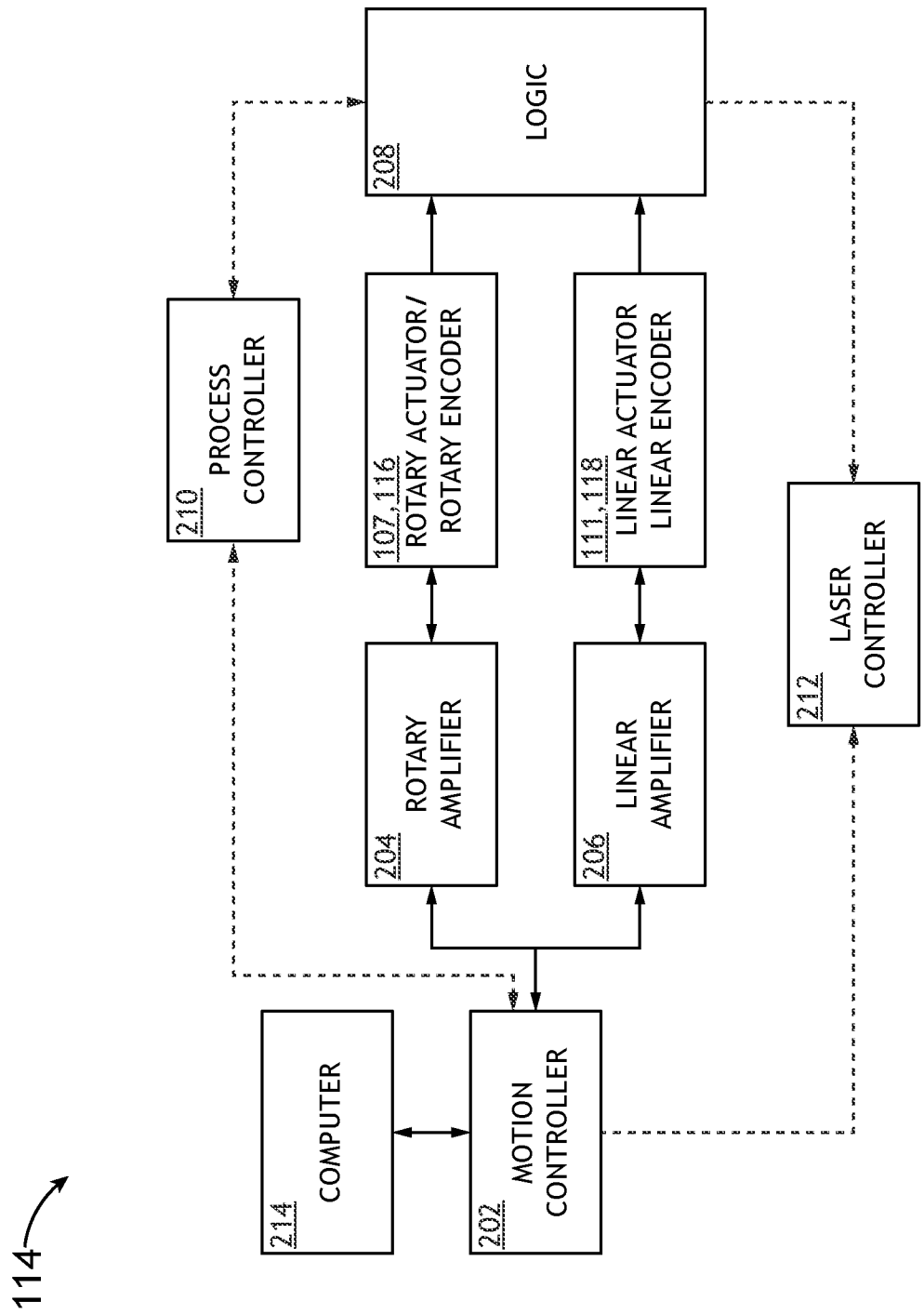
FIG. 2 illustrates a block diagram view of a control system for controlling one or more characteristics of the broadband source, in accordance with one or more embodiments of the present disclosure.

FIG. 2 illustrates a block diagram view of the control system 114, in accordance with one or more embodiments of the present disclosure. In embodiments, the control system 114 includes a motion controller 202, a process controller 210, and a laser controller 212. In addition, the control system 114 may include a computer 214 (or any other GUI-enabled device). In embodiments, the motion controller 202 directs the rotary actuator 107 and/or the linear actuator 111 in order to control the rotational and/or linear motion (position, speed, and acceleration) of the drum 102. In embodiments, the signals from the motion controller 202 may be amplified via the rotary amplifier 204 and the linear amplifier 206 and transmitted to the rotational actuator 107 (e.g., servo motor) and linear actuator 111 respectively. In turn, the rotational actuator 107 and the linear actuator 111 may actuate the drum 102 as directed by the motion controller 202. One or more logic elements 208 (e.g., field programmable gate arrays (FPGAs)) may readout position information from the rotational encoder 116 integrated with the rotational actuator 107 and/or the linear encoder 118 integrated with the linear actuator 111. For example, the one or more logic elements 208 may readout an electrical signal from the cable/wire output from the rotational encoder 116 and/or the linear encoder 118. Then, this rotational and linear position information may be transmitted to the process controller 210 and/or the laser controller 212. In the case of the laser control, the position information from the one or more logic elements may serve as a triggering reference for the pulsed laser source 104. In this regard, the laser controller 212 may receive the position information from the one or more logic elements and then fire the pulsed laser source 104 based on the position information. For example, in the case of a down-stroke of the rotatable drum 102, the laser controller 212 may fire the pulsed laser source 104 instantaneously (or nearly instantaneously) to when the indices of the rotational encoder 116 are read out by the one or more logic elements 208. Then, in the case of the up-stroke targeting, the laser controller 212 may impart a selected time delay between the reading out of the indices and the firing of the pulsed laser source 104 or utilized an encoder with a second set of indices (offset relative to the first set of indices). In the case of process control, the process controller 210 may analyze the position information and feed that information back to the motional controller 202, which may then make adjustments in the rotational and/or linear motion of the drum 102 and/or adjustments to the pulsed laser source via the laser controller 212. Additional laser control and/or drum position control scenarios are described further herein.

Figure 3:
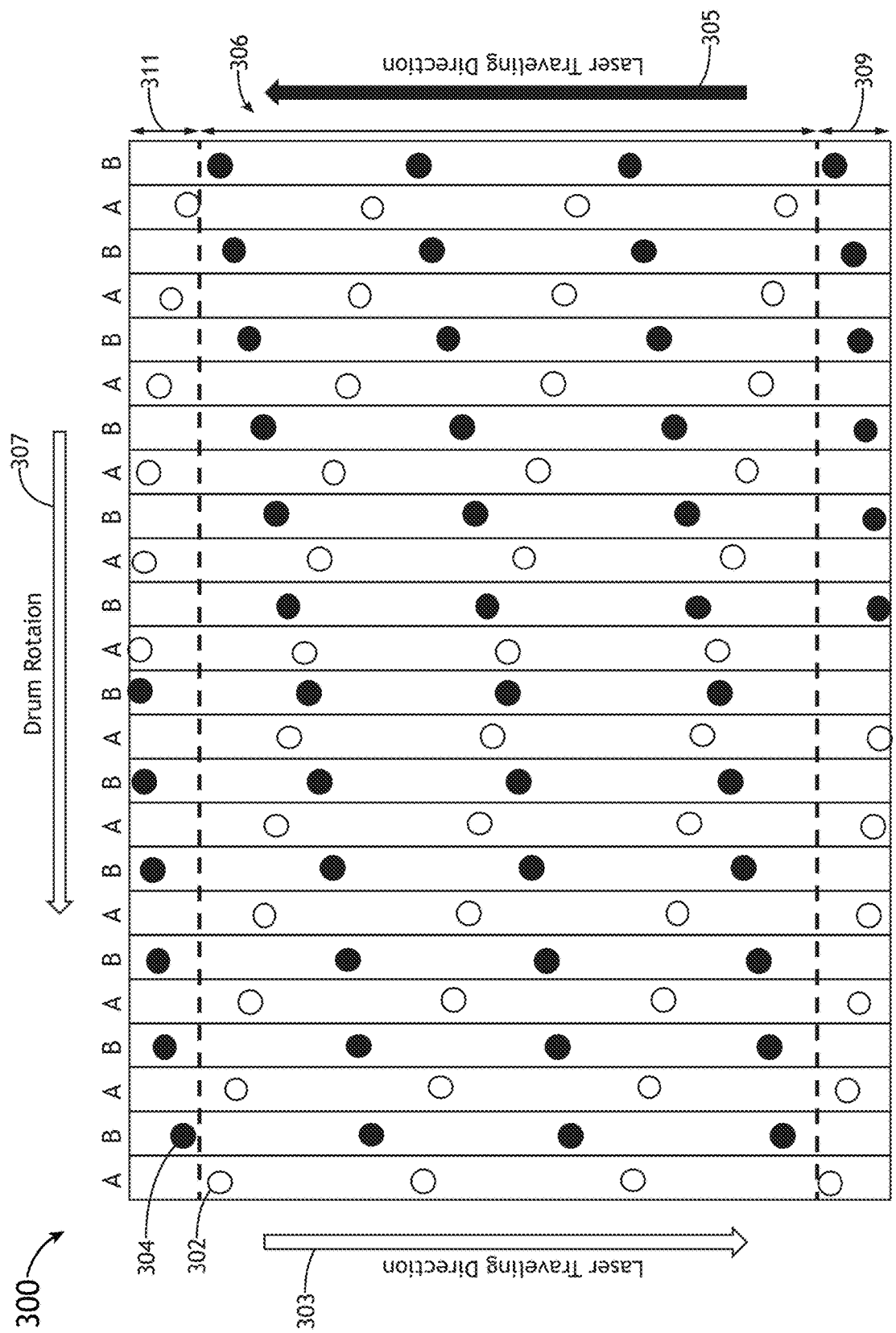
FIG. 3 illustrates a conceptual view of a first set of spots and a second set of spots distributed across the surface of a rotatable drum of the broadband source, in accordance with one or more embodiments of the present disclosure.

FIG. 3 illustrates a conceptual view 300 of a first set of spots and a second set of spots distributed across the surface of the drum 102, in accordance with one or more embodiments of the present disclosure. In embodiments, as the drum 102 is rotated, the pulsed illumination source 104 directs pulsed illumination 105 to a first set of spots 302 traversing a material-coated portion of the drum 102 in a first direction 303. Additionally, as the drum 102 continues to rotate, the pulsed illumination source 104 directs pulsed illumination 105 to a second set of spots 304 traversing the material-coated portion of the drum 102 in a second direction 305. In embodiments, the first set of spots 302 and the second set of spots 304 each form a spiral pattern about the surface of the rotating drum 102, noting that the surface depicted in FIG. 3 is representative of a cylindrical surface spanning—180° to +180° about the axis of the cylinder along the rotational direction 307. In embodiments, the drum 102 may be rotated at a selected constant rotational velocity (e.g., constant drum RPM) in the overlap region 306 along the rotational direction. In embodiments, the drum 102 may be rotationally decelerated/accelerated in the turn-around regions 309, 311.

Figure 4:
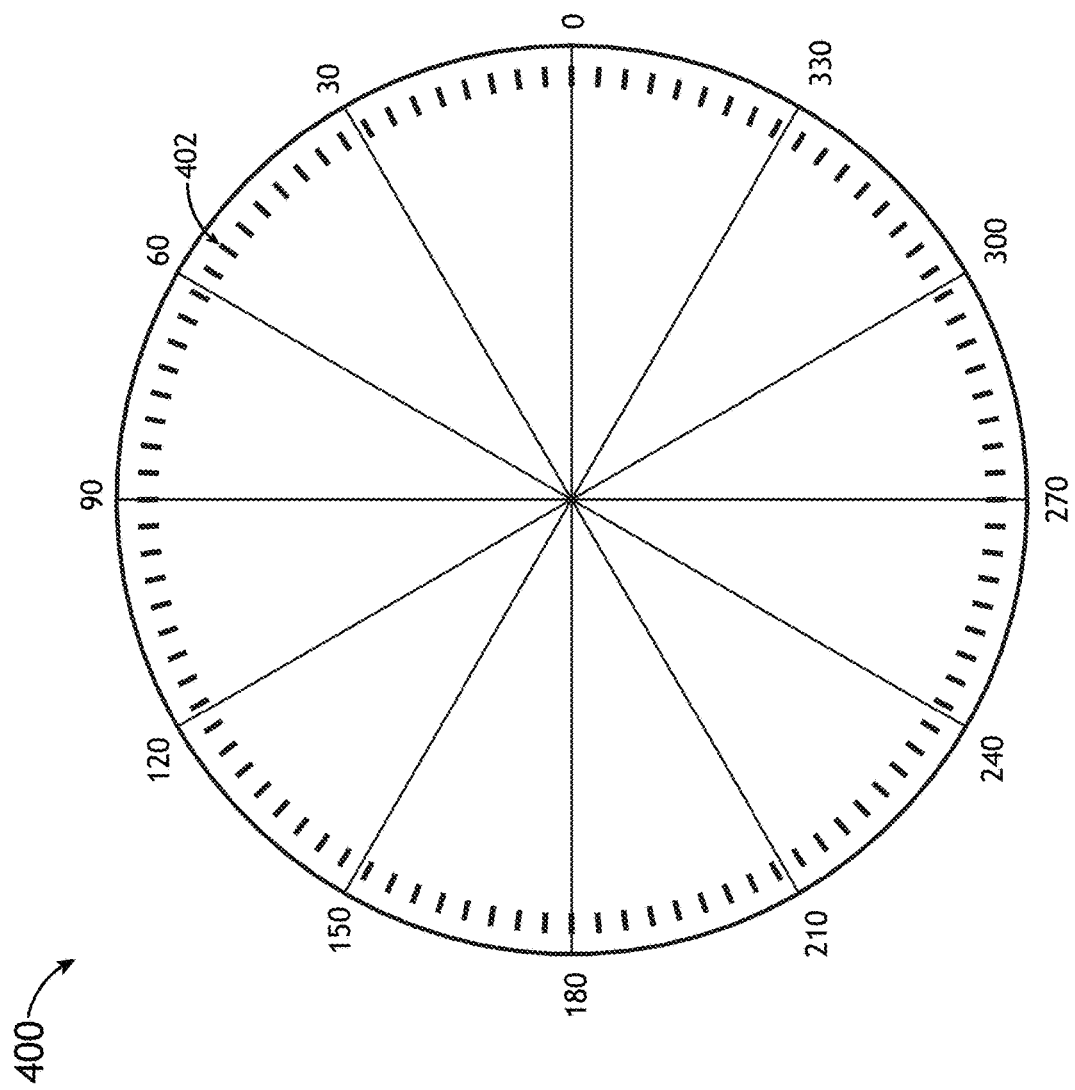
FIG. 4 illustrates an encoder with a single triggering sequence capable of producing interlaced sets of target spots on the surface of the rotatable drum of the broadband source, in accordance with one or more embodiments of the present disclosure.

FIG. 4 illustrates an encoder 400 with a single triggering sequence capable of producing interlaced sets of target spots 302, 304 on the surface of drum 102, in accordance with one or more embodiments of the present disclosure. The encoder 400 includes a single set of indices 402. In embodiments, the encoder 400 provides a control feature to the Broadband source 100 to form the first set of spots 302 so not to overlap with the second set of spots 304, as shown in FIG. 3. As discussed previously, the indices 402 may be used by the control system 114 to i) serve as a triggering reference for the pulsed laser source 104; ii) adjusting rotational and/or linear speed of the drum 102; and/or iii) synchronizing the pulsed laser source 104 and a detector. For example, a readout signal (e.g., via electrical wire(s)) from the rotary encoder 400 may serve as an external trigger to the pulsed laser source 104. During the down-stroke 303, the encoder-based indices may cause the pulsed laser source 104 to generate laser pulses at a selected frequency Then, during the turnaround region 309, the control system 114 may cause shift so that the second set of spots 304 of the up-stroke 305 are shifted relative to the first set of spots 302 (e.g., shifted by a half-cycle). For example, in the case of the single encoder 400, during the down-stroke 303, the pulsed laser source 104 may be triggered instantaneously (or nearly-instantaneously) at each of the indices 402, while during the up-stroke 305, the triggering of the pulsed laser source 104 may be delayed by some fixed delay. This delay will cause the second set of spots 304 to be shifted relative to the first set of spots 302.

Figure 5:
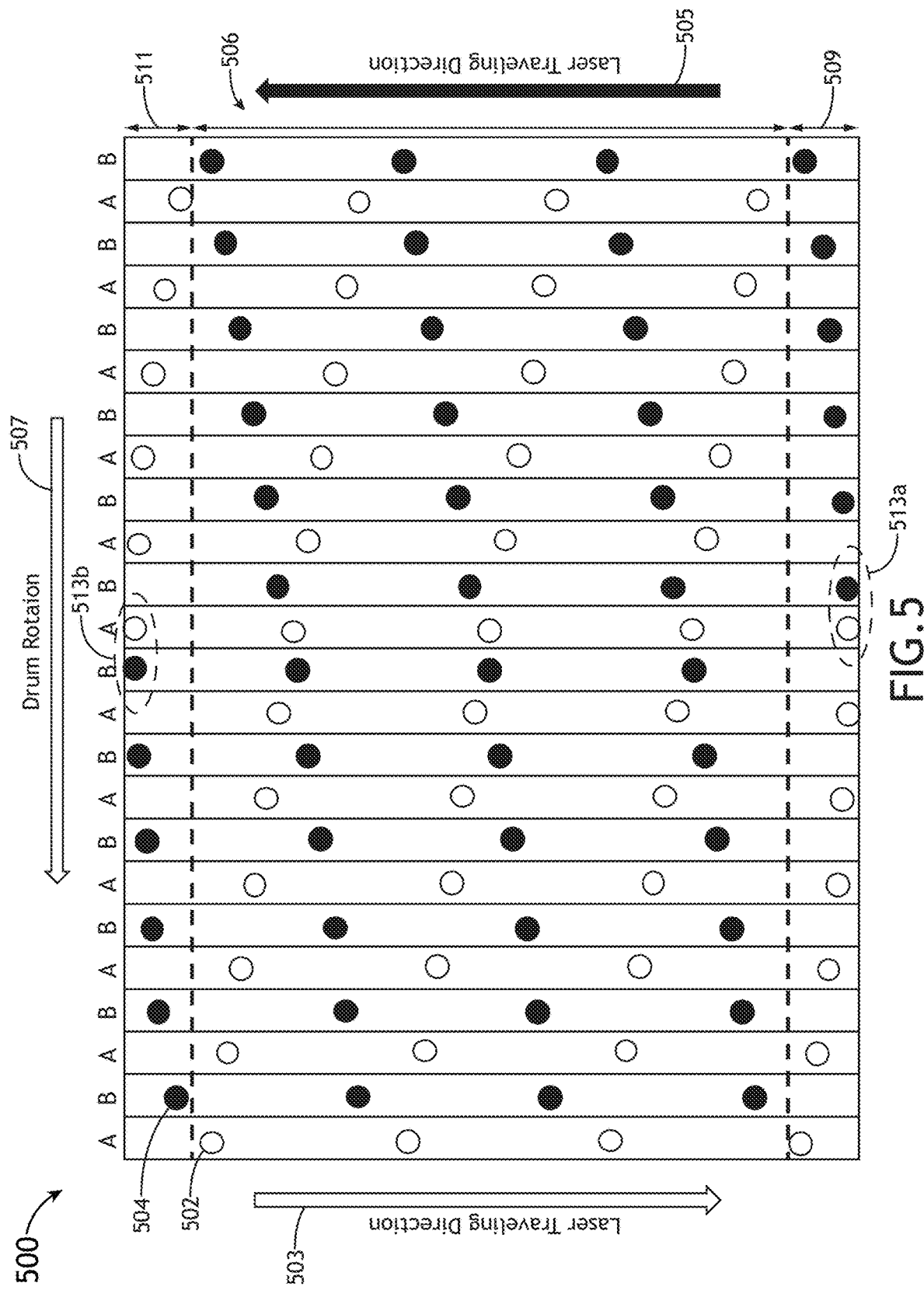
FIG. 5 illustrates a conceptual view of a first set of spots and a second set of spots distributed across the surface of the rotatable drum of the broadband source, in accordance with one or more additional and/or alternative embodiments of the present disclosure.

FIG. 5 illustrates a conceptual view 500 of a first set of spots and a second set of spots distributed across the surface of the drum 102 and generated by a two-sequence encoder, in accordance with one or more additional and/or alternative embodiments of the present disclosure. It is noted that the various features of the arrangement of spots depicted in FIG. 3 should be interpreted to extend to the arrangement of FIG. 5 unless otherwise noted.

Figure 6:
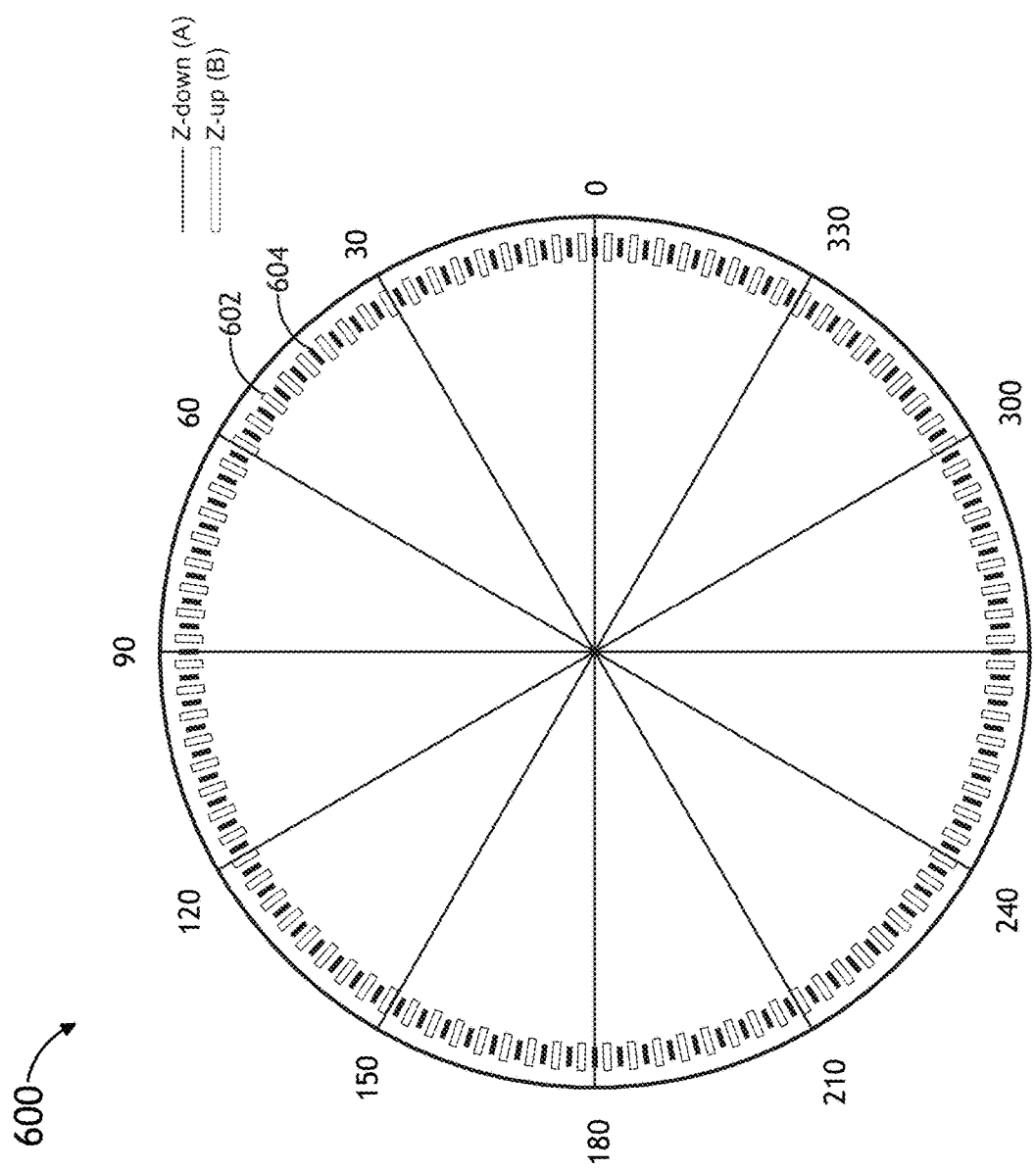
FIG. 6 illustrates an encoder with two triggering sequences capable of producing interlaced sets of target spots on the surface of the rotatable drum of the broadband source, in accordance with one or more embodiments of the present disclosure.

FIG. 6 illustrates an encoder 600 with two triggering sequences capable of producing interlaced sets of target spots 502, 504 on the surface of drum 102, in accordance with one or more embodiments of the present disclosure. It is noted herein that the various general features of the encoder 400 should be interpreted to extend to encoder 600 and are not repeated here for the purposes of brevity. The encoder 600 includes two sets of indices 602, 604. In this embodiment, the first set of indices 602 may be used as a triggering reference for the pulsed laser source 104 during the down-stroke 503, while the second set of indices 604 may be used a triggering reference for the pulsed laser source 104 during the up-stroke 505. For example, during the down-stroke 503, the encoder-based indices 602 may cause the pulsed laser source 104 to generate laser pulses at a selected frequency. Then, during the turnaround region 509 (moving from down-stroke to up-stroke), the control system 114 may switch the triggering reference to the second set of indices 604 for implementation during the up-stroke 505. Similarly, during the turnaround region 511 (moving from the up-stroke to the down-stroke), the control system 114 may switch the triggering reference back to the first set of indices 602 for implementation during the down-stroke 503. The switch in indices on the encoder 600 corresponds to the switchover occurrences 513a, 513b on the drum 102. The switching from the down-stroke to the up-stroke (and vice-versa) may be carried out over a selected time period, which is carried out via logic element 208 of the control system 114. In this embodiment, unlike the singe triggering sequence case, the Broadband source 100 does not require a triggering delay for the pulses of the up-stroke. For example, the pulsed laser source 104 may be triggered instantaneously (or nearly-instantaneously) for the indices 602 of the down-stroke 503 and the indices 604 of the up-stroke. Due to the interleaving of the individual indexes of indices 602, 604 on the encoder 600, the target locations of the up-stroke 505 will be offset relative to the target locations of the down-stroke 503.

Figure 7:
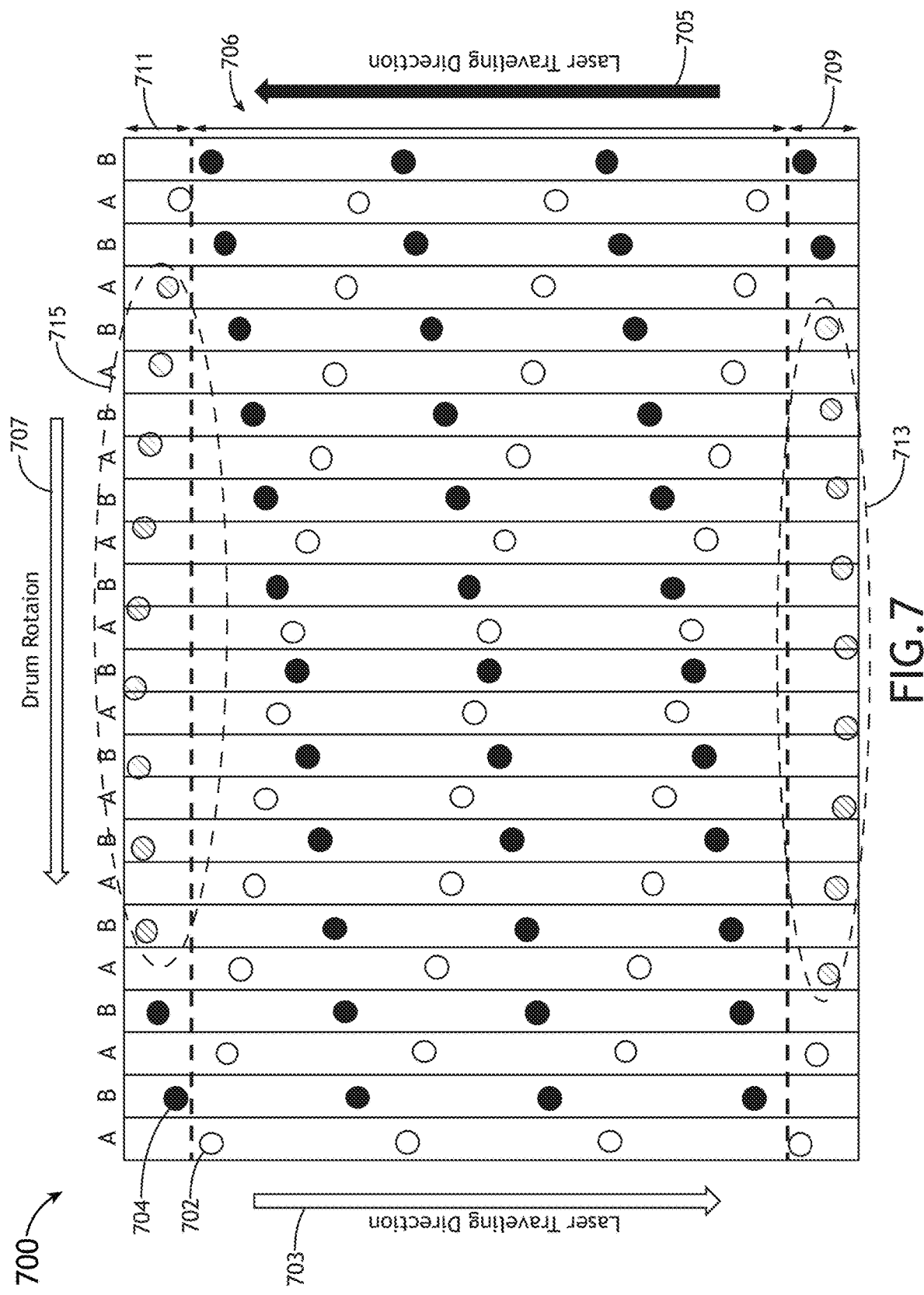
FIG. 7 illustrates a conceptual view of a first set of spots and a second set of spots distributed across the surface of the rotatable drum of the broadband source, in accordance with one or more additional and/or alternative embodiments of the present disclosure.

FIG. 7 illustrates a conceptual view 700 of a first set of spots and a second set of spots distributed across the surface of the drum 102 and generated by a three-sequence encoder, in accordance with one or more additional and/or alternative embodiments of the present disclosure. It is noted that the various features of the arrangement of spots depicted in FIG. 5 should be interpreted to extend to the arrangement of FIG. 7 unless otherwise noted.

Figure 8:
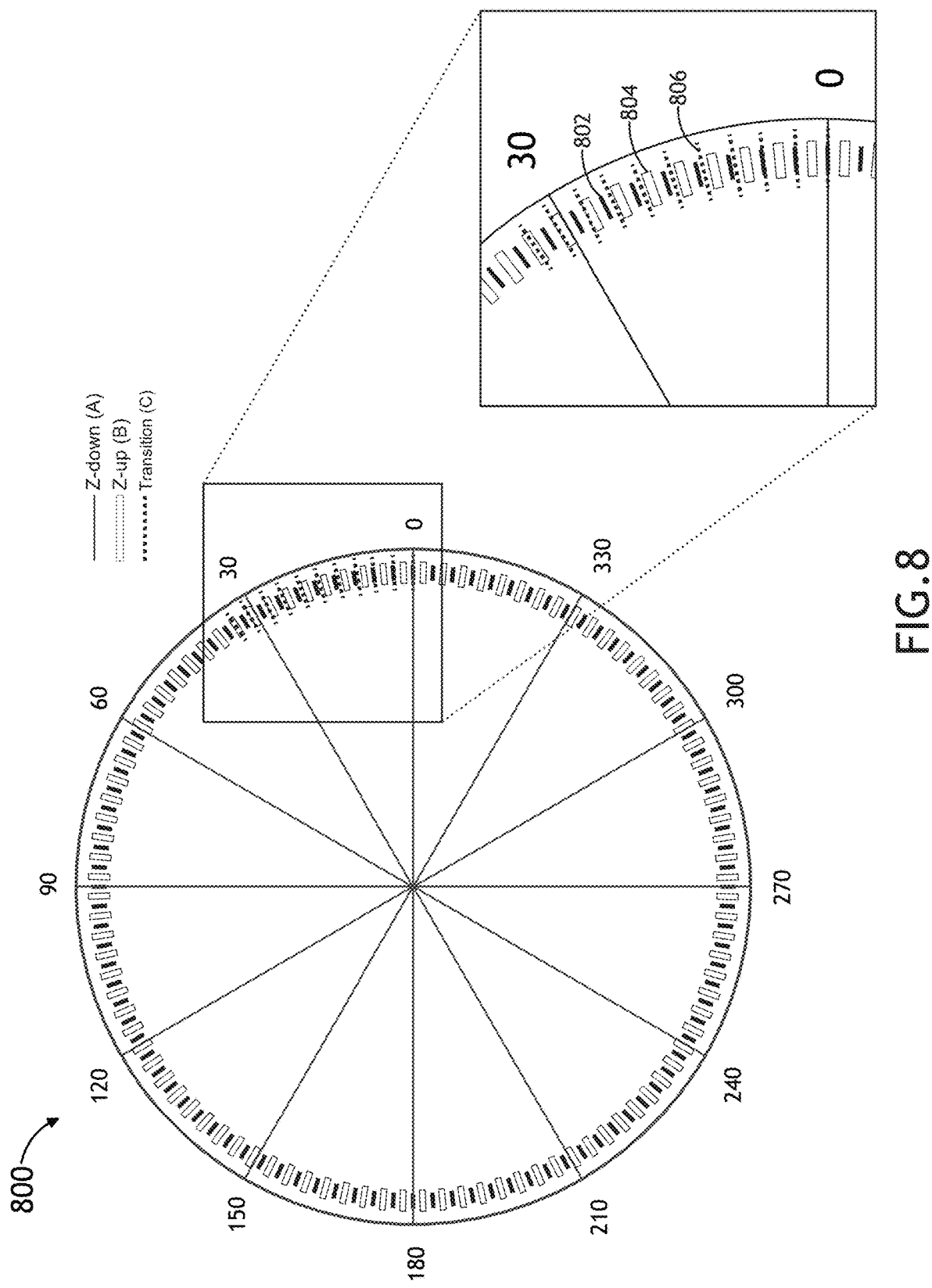
FIG. 8 illustrates an encoder with three triggering sequences capable of producing interlaced sets of target spots and transition spots on the surface of the rotatable drum of the broadband source, in accordance with one or more embodiments of the present disclosure.

FIG. 8 illustrates an encoder 800 with three triggering sequences capable of producing interlaced sets of target spots 702, 704 and the transition spots 713 and 715 on the surface of drum 102, in accordance with one or more embodiments of the present disclosure. It is noted herein that the various general features of the encoder 600 should be interpreted to extend to encoder 800 and are not repeated here for the purposes of brevity. The encoder 800 includes three sets of indices 802, 804, 806. In this embodiment, the first set of indices 802 may be used as a triggering reference for the pulsed laser source 104 during the down-stroke, while the second set of indices 804 may be used a triggering reference for the pulsed laser source 104 during the up-stroke. In addition, the third set of indices 806 may be considered a dynamic encoding system and provides for a transition region between the down-stroke spots 702 and the up-stroke spots 704. In this sense, the third set of indices 806 may be used to switch the laser cratering process during switching regions 713/715 from the triggering caused by the first set of indices 802 and the triggering caused by the second set of indicates 804 by changing the frequency of laser firing from that implemented by the first and second indices 802, 804. The changed frequency percentage during the transfer between the down-stroke spots 702 and the up-stroke spots 704 may be controlled by the number of the third set of indices 806. For example, the change in frequency is approximately 1% if there are 50 switching shots (i.e., the number of shots within the switching regions 713/715) and approximately 0.5% if there are 100 switching shots.

Figure 9:
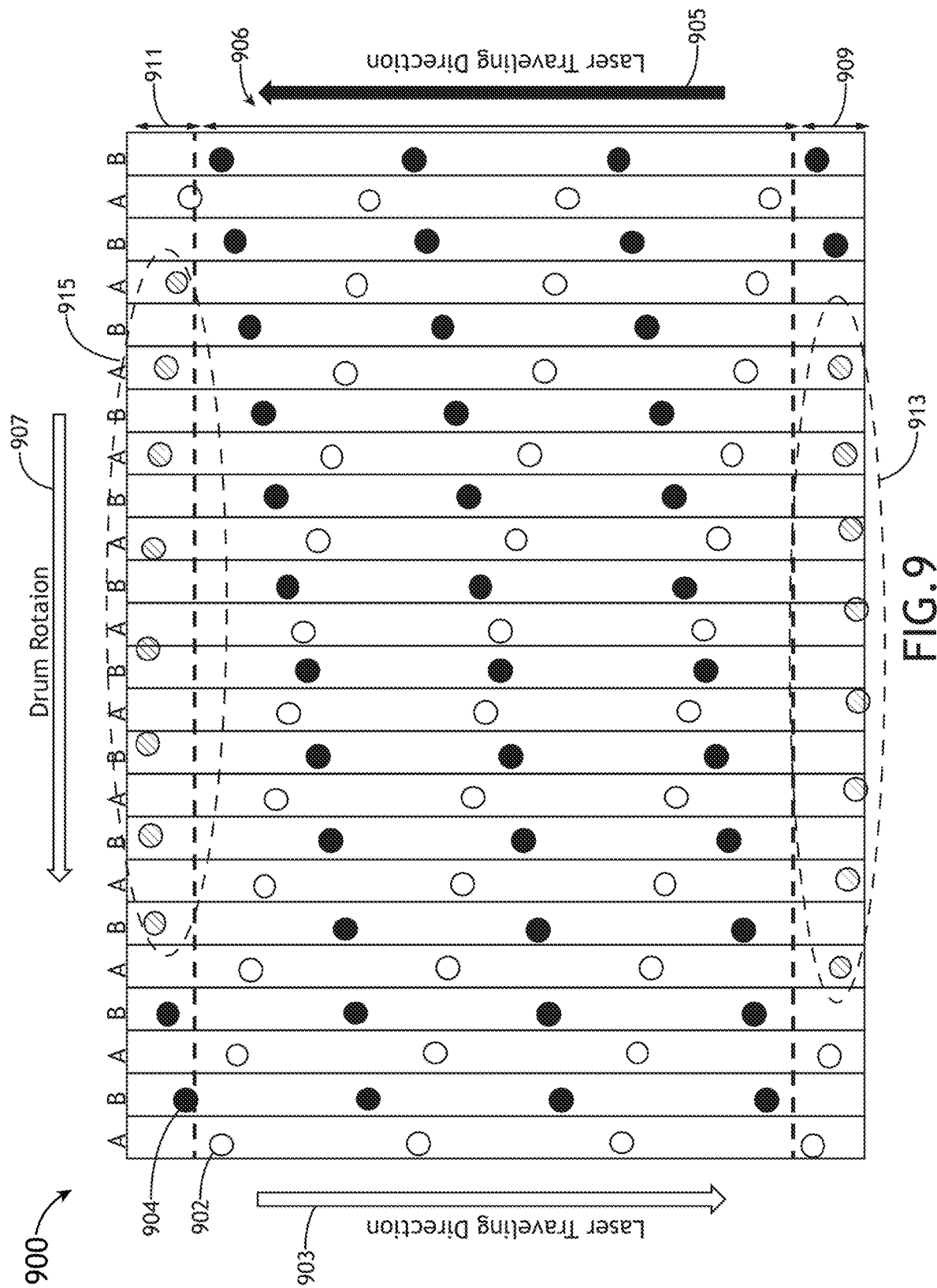
FIG. 9 illustrates a conceptual view of a first set of spots and a second set of spots distributed across the surface of the rotatable drum of the broadband source, in accordance with one or more additional and/or alternative embodiments of the present disclosure.

FIG. 9 illustrates a conceptual view 900 of a first set of spots and a second set of spots distributed across the surface of the drum 102 and generated by a three-sequence encoder, in accordance with one or more additional and/or alternative embodiments of the present disclosure. It is noted that the various features of the arrangement of spots depicted in FIG. 7 should be interpreted to extend to the arrangement of FIG. 9 unless otherwise noted. In embodiments, in the turn-around regions 909, 911, the drum 102 may be accelerated (or decelerated) to impart a temporary increase (or decrease) in rotational speed of the drum 102. For example, in the turn-around region 909, at the end of the down-stroke 903, the drum rotational speed (RPM) is increased (or decreased) relative to the constant velocity region 906 for a period of time and then decreased (or increased) back to the constant velocity of region 906 upon the start of the up-stroke 905. Similarly, in the turn-around region 911, at the end of the up-stroke 905, the drum rotational speed (RPM) is increased (or decreased) relative to the constant velocity region 906 for a period of time and then decreased (or increased) back to the constant velocity of region 906 upon the start of the down-stroke 903. In embodiments, during transition period 913 (or 915), the laser pulse period may stay the same while the rotational speed of the drum is increased. In embodiments, the dynamic encoding sequence 806 may be implemented in combination with the acceleration/deceleration of the drum to shift between the down-stroke target spots 902 and the up-stroke target spots 904 generated by indices 802 and indices 804 (and vice-versa).

While much of the present disclosure has focused on the utilization of an encoder indices to control the laser firing of the pulsed laser source, it is noted that the drum acceleration/ deceleration scheme of FIG. 9 may be implemented with or without the various encoding sequences of the present disclosure. In alternative embodiments, the control system 114 may utilize the laser clock (as opposed to the rotary encoder indices) as a triggering reference. In this regard, the laser clock may act as the primary triggering reference for the pulsed laser source 104 and may be used a reference when controlling the rotational and/or vertical motion of the drum 102.

Figure 10:
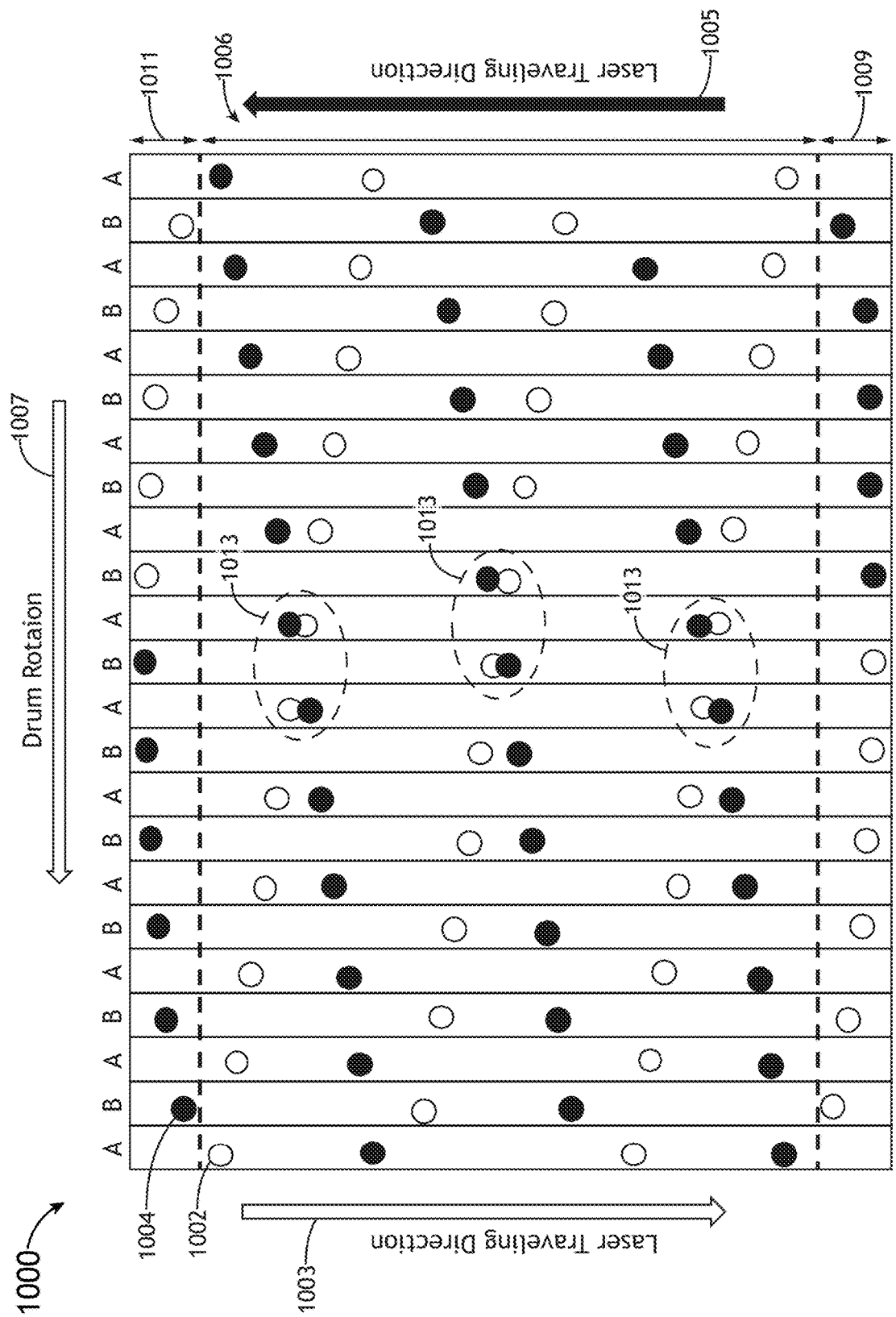
FIG. 10 illustrates a conceptual view of a first set of spots and a second set of spots distributed across the surface of the rotatable drum of the broadband source, in accordance with one or more additional and/or alternative embodiments of the present disclosure.

FIG. 10 illustrates a conceptual view 1000 of a first set of spots and a second set of spots distributed across the surface of the drum 102, in accordance with one or more additional and/or alternative embodiments of the present disclosure. It is noted that the various features of the arrangement of spots depicted in FIG. 9 should be interpreted to extend to the arrangement of FIG. 10 unless otherwise noted. In this embodiment, the first set of spots 1002 and the second set of spots 1004 may be generated via a two-sequence encoder where the numbers of indices within the first set of indices is different from the number of indices within the second set of indices. For example, as shown in FIG. 10, the number of columns associated with the first set of indices is an even number, while the number of columns associated with the second set of indices is an odd number. In this example, the laser firing frequency of the pulsed laser source 104, controlled by the first and second indices of the encoder (not shown) may be a selected frequency. It is noted that while using an encoder with different number of indices within the first and second sets of indices ensures that the spots 904 of the up-stroke 1005 do not coincide entirely with the spots 902 of the down-stroke 1003, this approach cannot ensure that there is not some overlap, such as that depicted in regions 1013, which corresponds with the intersection of some of the indices of the first set of indices with some of the indices of the second set of indices.

Figure 11:
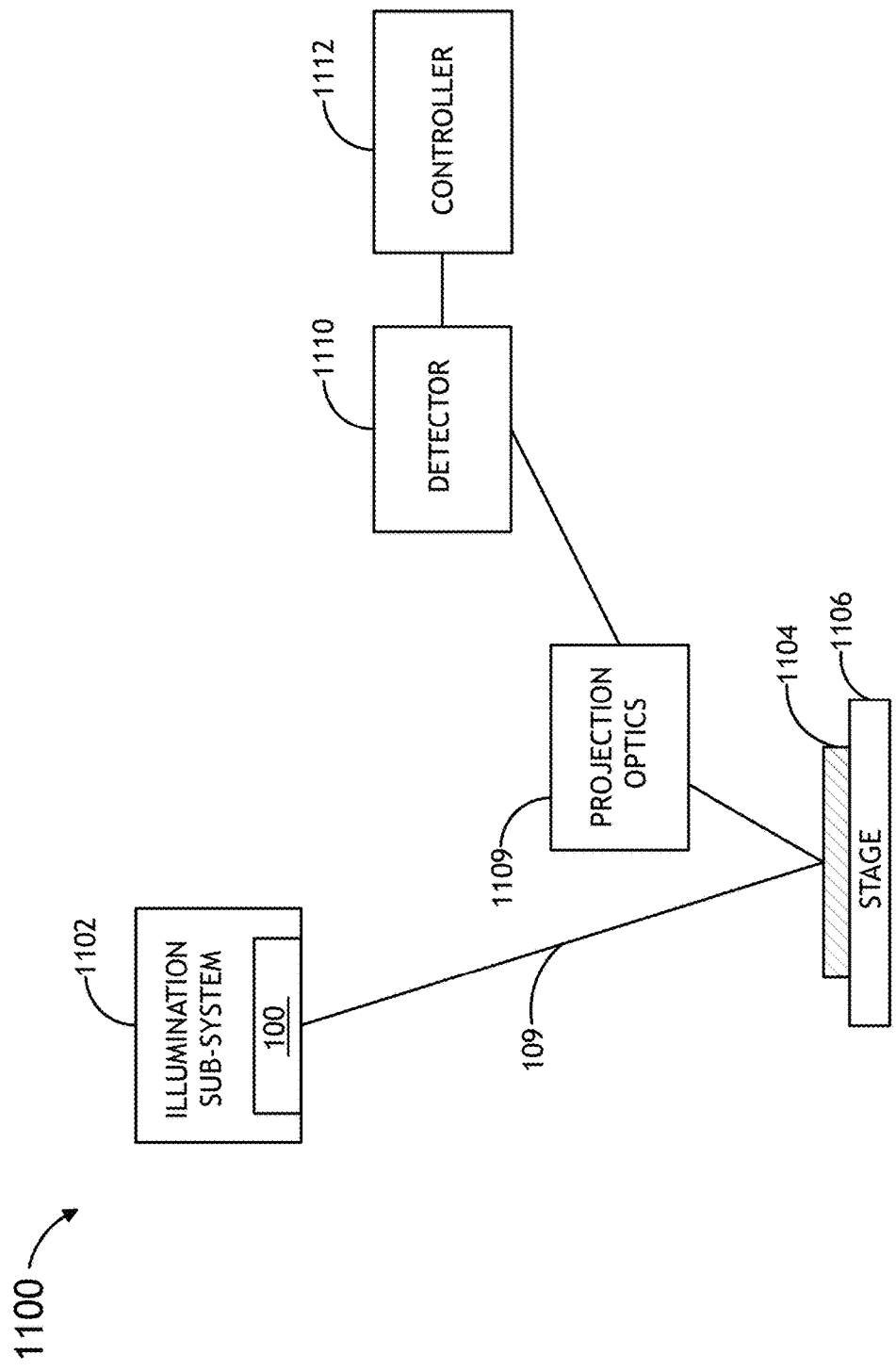
FIG. 11 illustrates a block diagram view of an inspection system incorporating the broadband light source, in accordance with one embodiment of the present disclosure.

FIG. 11 illustrates a block diagram view of an inspection system 1100 incorporating a plasma-based illumination source 100, in accordance with one or more embodiments of the present disclosure. In embodiments, the system 1100 includes an illumination sub-system 1102. The illumination sub-system 1102 may incorporate the Broadband source 100 described throughout the present disclosure. In embodiments, although not shown in FIG. 11, the system 1100 includes a set of illuminator optics. In embodiments, the illuminator optics may direct illumination 109 emanating from the Broadband source 100 to one or more samples 1104 disposed on a sample stage 1106. For example, the one or more samples 1104 may include, but are not limited to, a wafer (e.g., semiconductor wafer). By way of another example, the one or more samples 1104 may include, but are not limited to, a reticle or photomask. In embodiments, the system 1100 includes one or more detectors 1110. In embodiments, the system 1100 includes a set of projection optics 1109 suitable for collecting light scattered, reflected, diffracted, or otherwise emanating from the specimen and directing the light to the one or more detectors (e.g., CCD, TDI-CCD, PMT and the like). In embodiments, the system 1100 includes a controller 1112 for receiving and/or analyzing the measurement results from the detector 1110.

In embodiments, the inspection system 1100 is configured as a wafer inspection system or a reticle/photomask inspection system. For example, the inspection system 1100 may include any wafer or reticle/photomask inspection optical architecture known in the art suitable for operating in the EUV spectral range. By way of another example, the inspection system 1100 may include any wafer or reticle/photomask inspection optical architecture known in the art suitable for operating in the soft x-ray spectral range. It is further recognized that the inspection system 1100 may be configured as an EUV mask or mask blank inspection system. EUV-based mask blank inspection is described generally in U.S. Pat. No. 8,711,346 to Stokowski, issued on Apr. 29, 2014, which is incorporated herein by reference in the entirety. EUV-based mask blank inspection is described generally in U.S. patent application Ser. No. 13/417,982 to Xiong et al., filed on Mar. 12, 2012, which is incorporated herein by reference in the entirety. EUV-based reticle inspection is generally described in U.S. patent application Ser. No. 13/905,448 to Nasser-Ghodsi et al., filed on May 30, 2013, which is incorporated herein by reference in the entirety.

In embodiments, although not shown, the Broadband source 100 described throughout the present disclosure may be implemented within an optical lithography system. In embodiments, the optical lithography system (not shown) may include a set of illuminator optics configured to direct output light from the Broadband source 100 to an EUV-compatible lithography mask (e.g., EUV reflective mask) or a soft x-ray-compatible lithography mask. In embodiments, the optical lithography system includes a set of projection optics configured to receive illumination reflected from the mask and direct the reflected illumination from the mask to one or more wafers disposed on a wafer stage. The optical lithography system may include any broadband lithography system known in the art. EUV-based lithography is described generally in U.S. patent application Ser. No. 13/419,042 to Wang, filed on Mar. 13, 2012, which is incorporated herein by reference in the entirety.

Figure 12:
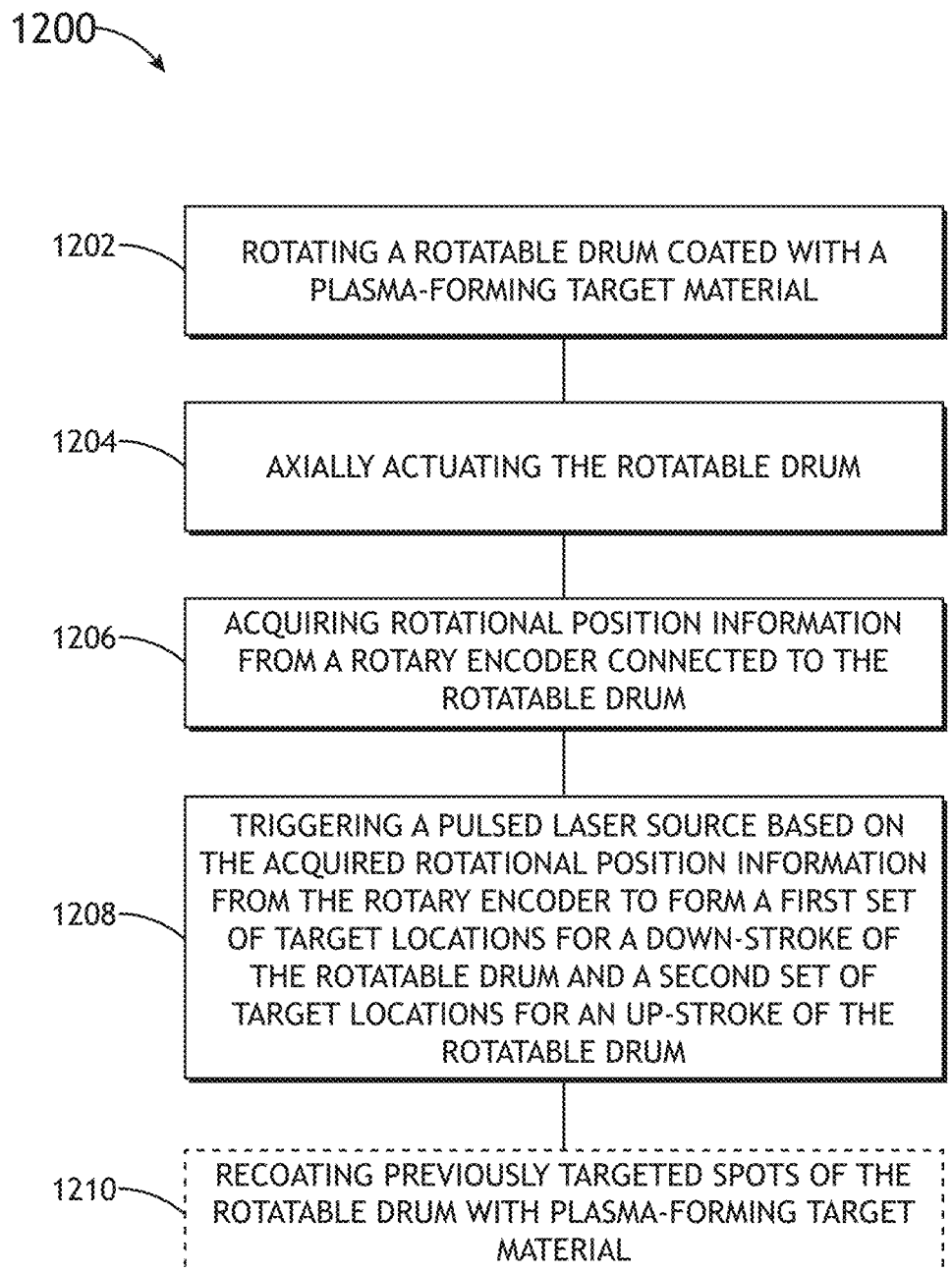
FIG. 12 illustrates a flow diagram depicting a method for generating continuous or near-continuous broadband light, in accordance with one or more embodiment of the present disclosure.

FIG. 12 illustrates a flow diagram depicting a method 1200 for generating continuous or near-continuous plasma-based illumination, in accordance with one embodiment of the present disclosure.

In step 1202, a rotatable drum at least partially coated with a plasma-forming target material is rotated. For example, as shown in FIG. 1A, a drum 102 may be rotated. For instance, the rotatable drum 102 may be rotated with a rotational actuator 107 such as, but not limited to, a servo motor at a selected rotational speed.

In step 1204, the rotatable drum 102 is axially actuated. For example, as shown in FIG. 1A, the rotatable drum 102 may be translated along an axial direction (e.g., vertical direction in FIG. 1A) via a linear actuator 111. The combination of the rotational and linear actuation is used to in direct pulsed laser from a pulsed laser source 104 to the surface of the drum 102 to a first set of spots traversing a material-coated portion of the drum in a first direction in a first spiral pattern and to a second set of spots traversing the material-coated portion of the drum in a second first direction in a second spiral pattern.

In step 1206, rotational position information of the drum 102 is acquired. For example, as shown in FIGS. 1A-10, the control system 114 may readout one or more electrical signals from a rotary encoder 116 integrated with the rotational actuator 107 (e.g., servo motor) and connected to the rotatable drum 102. In addition, the control system 114 may readout one or more electrical signals from a linear encoder 118 integrated with the linear actuator 111 and connected to the rotatable drum 102.

In step 1208, a pulsed laser source is triggered based on the acquired rotational position information from the rotary encoder. For example, the control system 114 may trigger the pulsed laser source 104 based on the acquired rotational position information from the rotary encoder 116 to form a first set of target locations for a down-stroke of the rotatable drum 102 and a second set of target locations for an up-stroke of the rotatable drum 102, whereby the second set of target locations are offset from the first set of target locations.

In step 1210, the previously-illuminated spots of the rotatable drum 102 are recoated with the plasma-forming material. For example, as shown in FIG. 1A, after exposure to a illumination 105 from the pulsed laser source 104, the material source 112 may recoat the rotating drum 102 with the selected plasma-forming material (e.g., xenon or carbon dioxide), allowing the spots of the first and second patterns described previously herein to be re-exposed to illumination 105 on one or more subsequent passes.

Those having skill in the art will appreciate that there are various vehicles by which processes and/or systems and/or other technologies described herein can be embodied (e.g., hardware, software, and/or firmware), and that the preferred vehicle will vary with the context in which the processes and/or systems and/or other technologies are deployed. In some embodiments, various steps, functions, and/or operations are carried out by one or more of the following: electronic circuits, logic gates, multiplexers, programmable logic devices, FPGAs, ASICs, analog or digital controls/switches, microcontrollers, or computing systems. A computing system may include, but is not limited to, a personal computing system, mainframe computing system, workstation, image computer, parallel processor, or any other device known in the art. In general, the terms "control system" and "controller" of the present disclosure are broadly defined to encompass any device having one or more processors, which execute program instructions from a memory medium. The memory medium may include, but is not limited to, read-only memory, a random-access memory, a solid-state memory, a magnetic or optical disk, or a magnetic tape.

All of the methods described herein may include storing results of one or more steps of the method embodiments in a storage medium. The results may include any of the results described herein and may be stored in any manner known in the art. The storage medium may include any storage medium described herein or any other suitable storage medium known in the art. After the results have been stored, the results can be accessed in the storage medium and used by any of the method or system embodiments described herein, formatted for display to a user, used by another software module, method, or system, etc. Furthermore, the results may be stored "permanently," "semi-permanently," temporarily, or for some period of time. For example, the storage medium may be random access memory (RAM), and the results may not necessarily persist indefinitely in the storage medium.

Although particular embodiments of this invention have been illustrated, it is apparent that various modifications and embodiments of the invention may be made by those skilled in the art without departing from the scope and spirit of the foregoing disclosure. Accordingly, the scope of the invention should be limited only by the claims appended hereto.

What is claimed is:

1. A broadband light source comprising:
    a rotatable drum at least partially coated with plasma-forming target material;
    a rotational actuator configured to rotate the rotatable drum;
    a linear actuator configured to axially translate the rotatable drum;
    a rotary encoder connected to the rotatable drum, wherein the rotary encoder indicates a rotational position of the rotatable drum, wherein the rotary encoder comprises at least one of a double-sequence encoder or a triple-sequence encoder;
    linear encoder connected to the rotatable drum, wherein the linear encoder indicates an axial position of the rotatable drum;
    a laser source configured to direct pulsed illumination to a set of spots on the material-coated portion of the rotatable drum for exciting the plasma-forming target material and emitting broadband light as the rotational actuator rotates the rotatable drum and the linear actuator translates the rotatable drum in an axial direction; and
    a control system, wherein the control system is configured to receive one or more rotational position indicators from the rotary encoder and control triggering of the laser source based on the one or more rotational position indicators from the rotary encoder.

2. The light source of claim 1, wherein the set of spots comprises:
    a first set of spots arranged in a spiral pattern; and
    a second set of spots arranged in a spiral pattern, wherein the first set of spots and the second set of spots are interleaved such that spots from the second set of spots do not overlap with spots from the first set of spots.

3. The light source of claim 1, wherein the rotary encoder serves as a triggering reference for the laser source.

4. The light source of claim 1, wherein the control system is further configured to control rotational and axial motion of the rotatable drum based on at least one of the one or more rotational position indicators from the rotary encoder or the one or more axial position indicators from the linear encoder.

5. The light source of claim 2, wherein the control system is configured to direct the rotational actuator to accelerate the rotatable drum at a start of a turn-around portion of the rotatable drum and decelerate the rotatable drum at an end of the turn-around portion of the rotatable drum in order to offset the second set of spots such that spots from the second set of spots do not overlap with spots from the first set of spots.

6. The light source of claim 1, wherein the control system is configured to synchronize the triggering of the laser source with a data acquisition cycle of one or more sensors.

7. The light source of claim 1, wherein the control system comprises:
    a motion controller communicatively coupled to the rotational actuator and the linear actuator and configured to control the rotational actuator to control a rotational motion of the rotatable drum and the linear actuator to control an axial motion of the rotatable drum;
    a laser controller communicatively coupled to the laser source and configured to control the triggering of the laser source based on a position information from the rotary encoder; and
    a process controller configured to provide position feedback information to the motion controller based on position information from at least one of the rotary encoder or the linear encoder.

8. The light source of claim 1, wherein the laser source comprises a pulsed laser source.

9. The light source of claim 1, further comprising one or more collection optical elements configured to receive illumination emanated from a plasma generated in response to the excitation of the plasma-forming target material.

10. The light source of claim 1, wherein the rotatable drum comprises:
a cylinder.

11. The light source of claim 1, further comprising:
a material source configured to recoat previously-illuminated portions of the rotatable drum with the plasma-forming target material.

12. The light source of claim 1, wherein the plasma-forming target material comprises at least one of frozen xenon or frozen carbon dioxide.

13. The light source of claim 1, wherein the emitted broadband light comprises at least one of soft x-ray broadband light or EUV broadband light.

14. An inspection system comprising:
an illumination sub-system, wherein the illumination sub-system comprises:
a rotatable drum at least partially coated with plasma-forming target material;
a rotational actuator configured to rotate the rotatable drum;
a linear actuator configured to axially translate the rotatable drum;
a rotary encoder connected to the rotatable drum, wherein the rotary encoder indicates a rotational position of the rotatable drum, wherein the rotary encoder comprises at least one of a double-sequence encoder or a triple-sequence encoder;
linear encoder connected to the rotatable drum, wherein the linear encoder indicates an axial position of the rotatable drum;
a laser source configured to direct pulsed illumination to a set of spots on the material-coated portion of the rotatable drum for exciting the plasma-forming target material and emitting broadband light as the rotational actuator rotates the rotatable drum and the linear actuator translates the rotatable drum in an axial direction;
a control system, wherein the control system is configured to receive one or more rotational position indicators from the rotary encoder and control triggering of the laser source based on the one or more rotational position indicators from the rotary encoder;
one or more collection optics configured to collect illumination emanated from a plasma generated in response to the excitation of the plasma-forming target material;
a set of illuminator optics configured to direct illumination from the one or more collection optics to one or more samples disposed on a stage;
a detector; and
a set of projection optics configured to receive illumination from a surface of the one or more samples and direct the illumination from the one or more samples to the detector.

15. The inspection system of claim 14, wherein the inspection system is configured as a wafer inspection system.

16. The inspection system of claim 14, wherein the inspection system is configured as a reticle or photomask inspection system.

17. The inspection system of claim 14, wherein the illumination includes extreme ultraviolet light.

18. The inspection system of claim 14, wherein the set of spots comprises:
a first set of spots arranged in a spiral pattern; and
a second set of spots arranged in a spiral pattern, wherein the first set of spots and the second set of spots are interleaved such that spots from the second set of spots do not overlap with spots from the first set of spots.

19. The inspection system of claim 14, wherein the rotary encoder serves as a triggering reference for the laser source.

20. The inspection system of claim 14, wherein the control system is further configured to control rotational and axial motion of the rotatable drum based on at least one of the one or more rotational position indicators from the rotary encoder or the one or more axial position indicators from the linear encoder.

21. The inspection system of claim 18, wherein the control system is configured to direct the rotational actuator to accelerate the rotatable drum at a start of a turn-around portion of the rotatable drum and decelerate the rotatable drum at an end of the turn-around portion of the rotatable drum in order to offset the second set of spots such that spots from the second set of spots do not overlap with spots from the first set of spots.

22. The inspection system of claim 14, wherein the control system is configured to synchronize the triggering of the laser source with a data acquisition cycle of one or more sensors.

23. The inspection system of claim 14, wherein the control system comprises:
a motion controller communicatively coupled to the rotational actuator and the linear actuator and configured to control the rotational actuator to control a rotational motion of the rotatable drum and the linear actuator to control an axial motion of the rotatable drum;
a laser controller communicatively coupled to the laser source and configured to control the triggering of the laser source based on a position information from the rotary encoder; and
a process controller configured to provide position feedback information to the motion controller based on position information from at least one of the rotary encoder or the linear encoder.

24. The inspection system of claim 14, wherein the laser source comprises a pulsed laser source.

25. The inspection system of claim 14, further comprising one or more collection optical elements configured to receive illumination emanated from the plasma generated in response to the excitation of the plasma-forming target material.

26. The inspection system of claim 14, wherein the rotatable drum comprises:
a cylinder.

27. The inspection system of claim 14, further comprising:
a material source configured to recoat previously-illuminated portions of the rotatable drum with the plasma-forming target material.

28. The inspection system of claim 14, wherein the plasma-forming target material comprises at least one of frozen xenon or frozen carbon dioxide.

29. The inspection system of claim 14, wherein the emitted broadband light comprises at least one of soft x-ray broadband light or EUV broadband light.

30. A method comprising:
rotating a rotatable drum coated with a plasma-forming target material;

axially actuating the rotatable drum;
acquiring rotational position information from a rotary encoder connected to the rotatable drum, wherein the rotary encoder comprises at least one of a double-sequence encoder or a triple-sequence encoder;
triggering a pulsed laser source based on the acquired rotational position information from the rotary encoder to form a first set of target locations for a down-stroke of the rotatable drum and a second set of target locations for an up-stroke of the rotatable drum offset from the first set of target locations; and
recoating previously targeted spots of the rotatable drum with the plasma-forming target material.

* * * * *